United States Patent
Ito et al.

(10) Patent No.: US 11,616,189 B2
(45) Date of Patent: Mar. 28, 2023

(54) LAMINATED PIEZOELECTRIC ELEMENT

(71) Applicant: TAIYO YUDEN CO., LTD., Tokyo (JP)

(72) Inventors: Fumihisa Ito, Takasaki (JP); Yukihiro Matsui, Takasaki (JP)

(73) Assignee: TAIYO YUDEN CO., LTD., Tokyo (JP)

(*) Notice: Subject to any disclaimer, the term of this patent is extended or adjusted under 35 U.S.C. 154(b) by 982 days.

(21) Appl. No.: 16/286,343

(22) Filed: Feb. 26, 2019

(65) Prior Publication Data

US 2019/0280183 A1    Sep. 12, 2019

(30) Foreign Application Priority Data

Mar. 6, 2018 (JP) .............................. JP2018-039497

(51) Int. Cl.
*H01L 41/047* (2006.01)
*H01L 41/083* (2006.01)

(52) U.S. Cl.
CPC ........ *H01L 41/083* (2013.01); *H01L 41/0471* (2013.01); *H01L 41/0472* (2013.01)

(58) Field of Classification Search
CPC .............. H01L 41/083; H01L 41/0471; H01L 41/0472
See application file for complete search history.

(56) References Cited

U.S. PATENT DOCUMENTS

| 5,073,740 A | 12/1991 | Jomura et al. |
| 5,266,862 A * | 11/1993 | Ohya .............. H01L 41/0471 |
| | | 310/366 |
| 2017/0133578 A1* | 5/2017 | Suenaga .............. H04R 17/005 |

FOREIGN PATENT DOCUMENTS

| CN | 105374929 A * | 3/2016 | |
| JP | 01157581 A * | 6/1989 | ......... H01L 41/0471 |
| JP | H01157581 A | 6/1989 | |
| JP | 02119190 A * | 5/1990 | |
| JP | H02237083 A | 9/1990 | |
| JP | 08274381 A * | 10/1996 | |
| JP | 2011244379 A | 12/2011 | |
| JP | 5883202 B1 | 3/2016 | |
| WO | WO-2009082007 A1 * | 7/2009 | ......... H01L 41/0471 |

OTHER PUBLICATIONS

A Notice of Reasons for Refusal issued by the Japanese Patent Office, dated Dec. 21, 2021, for Japanese counterpart application No. 2018-039497. (2 pages).

* cited by examiner

*Primary Examiner* — J. San Martin
(74) *Attorney, Agent, or Firm* — Law Office of Katsuhiro Arai

(57) ABSTRACT

A laminated piezoelectric element 10 includes: a laminated body 11 in rectangle shape formed by alternately laminating a plurality of piezoelectric layers 15 and one or more internal electrode(s) 13; a connection electrode 14 connected to one end portion 13a of the internal electrode(s) 13; and an electric field relaxation region 16c or 16d formed discontinuously with regard to the internal electrode(s) 13 in at least one of two corner portions 13c and 13d of the other end portion 13b opposite to the one end portion 13a of the internal electrode(s) 13.

2 Claims, 4 Drawing Sheets

[FIG. 1]
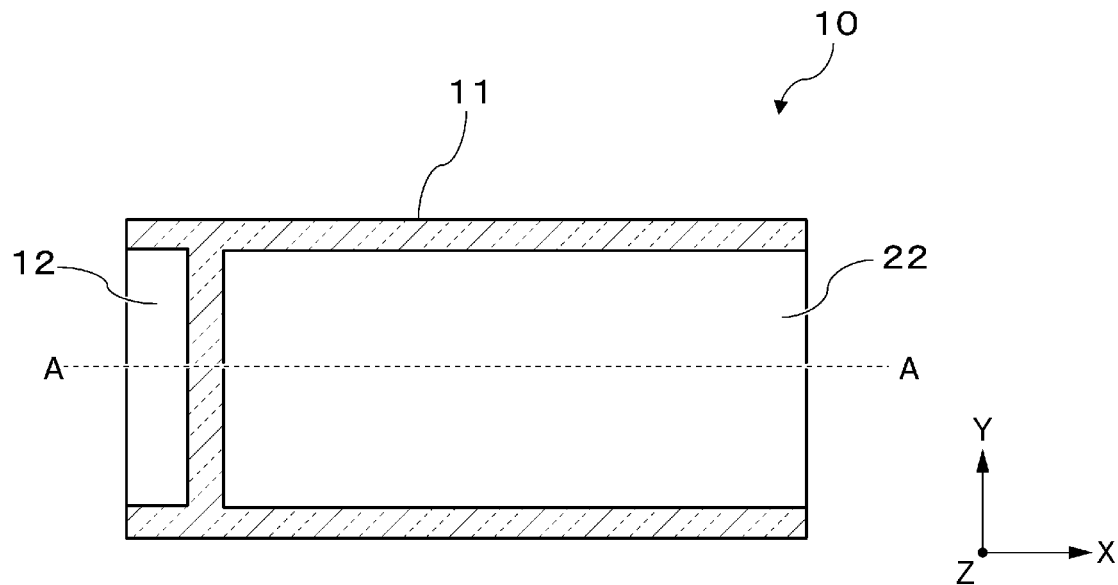
[FIG. 2]
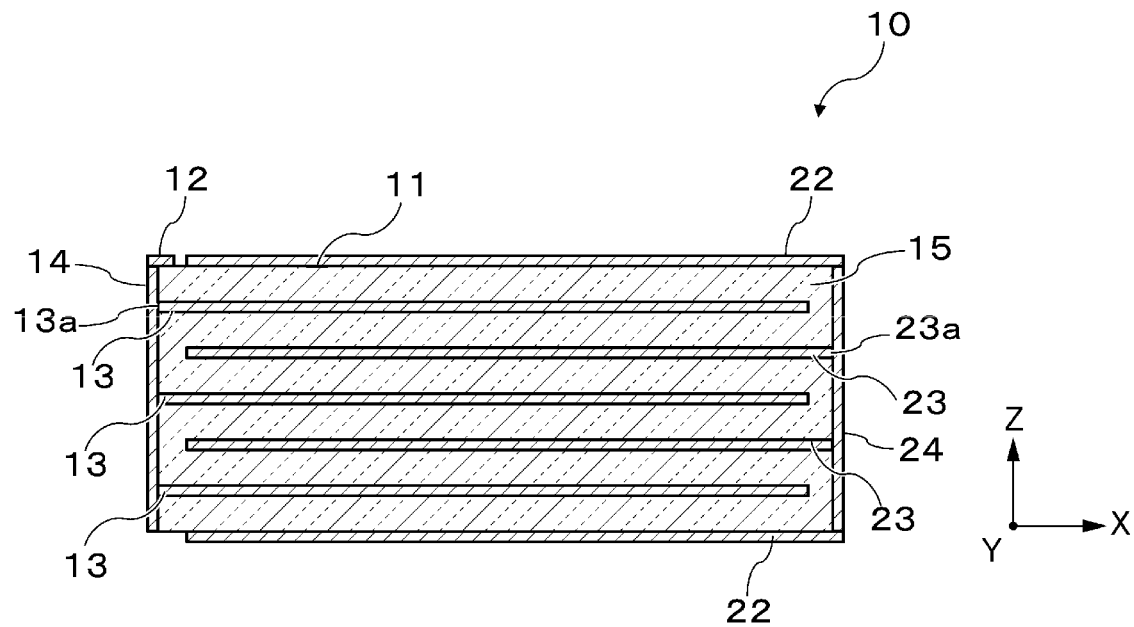

[FIG. 3]
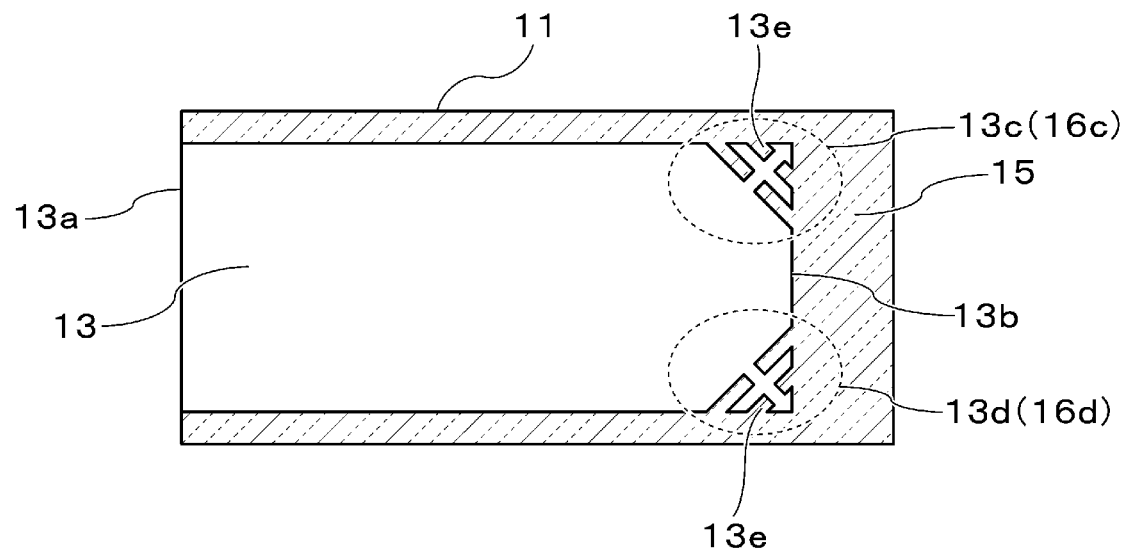
[FIG. 4]
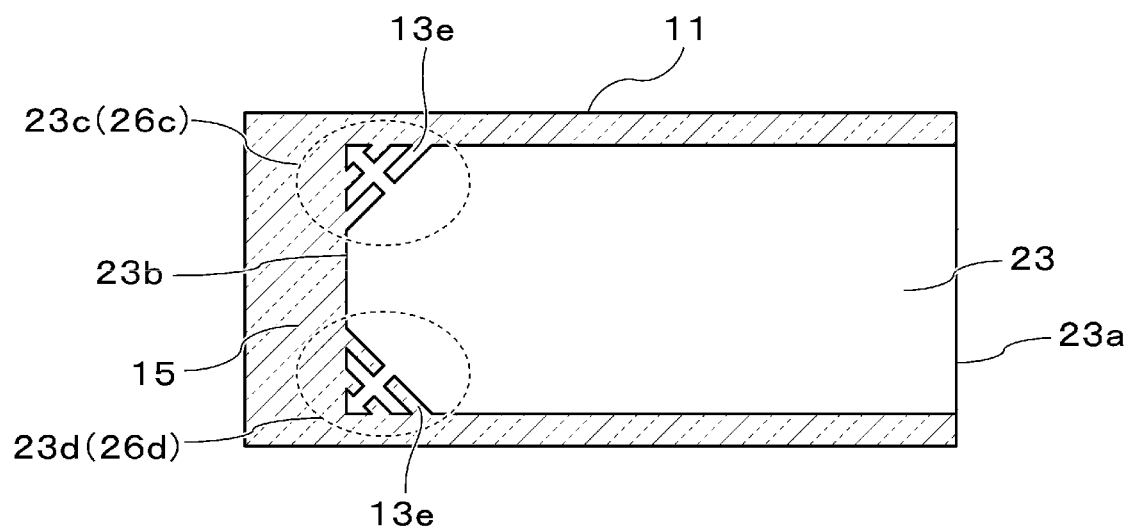

[FIG. 5]
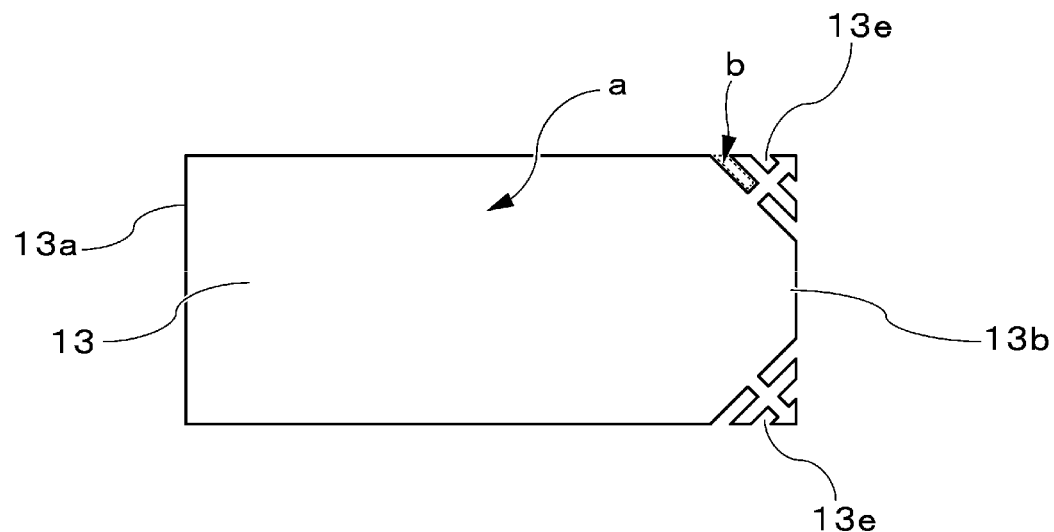
[FIG. 6]
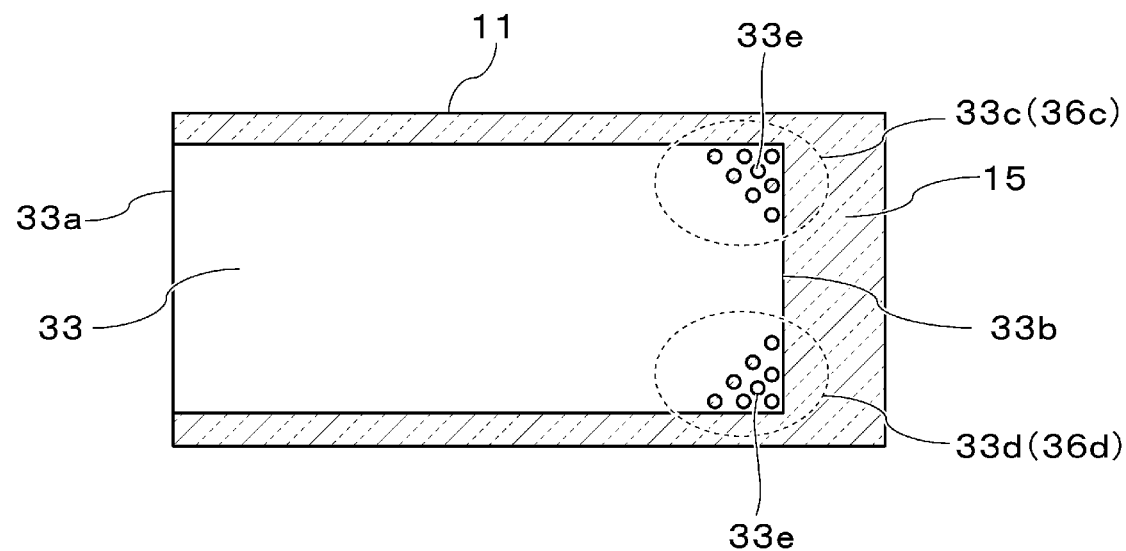

[FIG. 7]
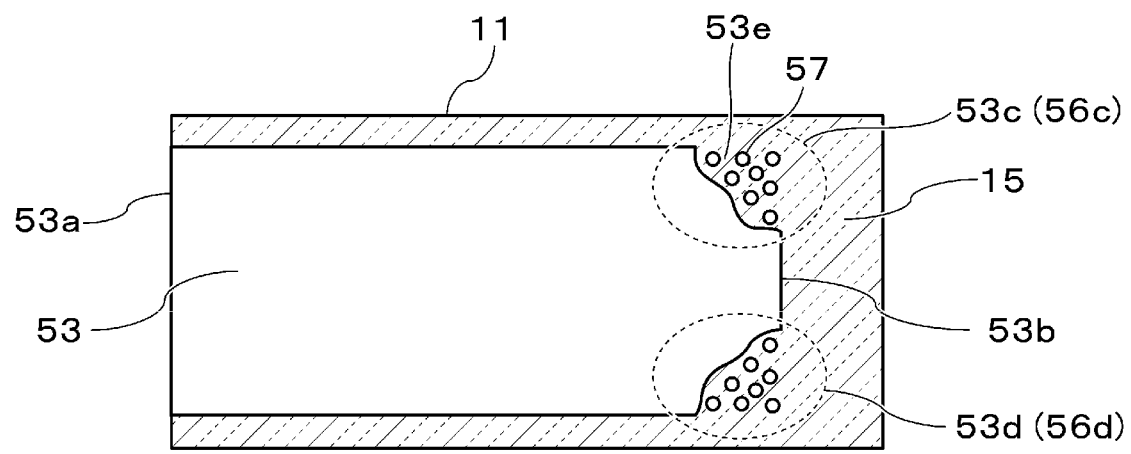

LAMINATED PIEZOELECTRIC ELEMENT

TECHNICAL FIELD

The present invention relates to a laminated piezoelectric element.

BACKGROUND ART

A piezoelectric element in rectangle shape is used for an application of a receiver, a speaker or the like in an electronic equipment such as a thin mobile phone or a thin tablet. In recent years, a liquid crystal display screen of such electronic equipment is being made larger in progress, and a larger displacement amount is required for the piezoelectric element, accordingly. In order to obtain a larger displacement amount, it may be enough to increase voltage to be applied to the piezoelectric element. However, dielectric breakdown is likely to occur in a piezoelectric layer located at corner portions of an internal electrode in which electric charge especially concentrates, when it is used for a long time with high voltage. Further, cracks may also occur at corner portions of the internal electrode of the piezoelectric element in which electric charge concentrates, resulting in that the piezoelectric element may be damaged.

In order to improve charge concentration in corner portions of the internal electrode, for example, Patent Literature 1 discloses a piezoelectric element comprising a laminated body in a rectangular shape in a top view in which a plurality of internal electrodes and a plurality of piezoelectric layers are laminated and a plurality of connecting electrodes connected with one side ends of the plurality of internal electrodes, wherein corner portions at the other side ends of the plurality of internal electrodes are formed into corner cutoff shape.

Further, Patent Literature 2 discloses a piezoelectric sounding body in which notches are formed in a part of electrodes among a plurality of electrodes adjacent in a thickness direction in a vicinity of respective four corners of a laminated piezoelectric element in rectangle shape.

However, since corners are missing due to cutoff shape or notch in the piezoelectric elements disclosed in the above-mentioned Patent Literatures, the thickness around corners becomes thinner in a laminated piezoelectric element having the structure in which the plurality of internal electrodes sandwich the piezoelectric layer, resulting in that a film thickness becomes non-uniform in a plane of the element. Therefore, in a case that the film thickness is non-uniform, cracks may occur in the piezoelectric layer through long time use.

CITATION LIST

Patent Literature

[Patent Literature 1] Japanese Patent No. 5883202
[Patent Literature 2] Japanese Unexamined Patent Application Publication No. 2011-244379

SUMMARY OF INVENTION

Technical Problem

The present invention has been made in view of the above circumstances, and the invention is to provide a laminated piezoelectric element helpful in suppressing dielectric breakdown and breakage even through long time use under high voltage.

Solution to Problem

As a result of intensive studies, the inventors have found that an internal electrode having a specific shape rather than a corner-cut internal electrode hardly generates not only electric field concentration even under higher voltage but dielectric breakdown and breakage even through long time use, and then the present invention has been accomplished.

A laminated piezoelectric element according to an aspect of the present invention includes: a laminated body in rectangle shape formed by alternately laminating a plurality of piezoelectric layers and one or more internal electrode(s); a connection electrode connected to one end portion of the internal electrode(s); and an electric field relaxation region formed discontinuously with regard to the internal electrode(s) in at least one of two corner portions of the other end portion opposite to the one end portion of the internal electrode(s).

The electric field relaxation region may be provided with a plurality of electrode deficient portions.

The plurality of electrode deficient portions may be made of holes.

Advantageous Effects of Invention

According to the present invention, it is possible to provide a laminated piezoelectric element helpful in suppressing dielectric breakdown and breakage even through long time use under high voltage.

BRIEF DESCRIPTION OF DRAWINGS

FIG. 1 is a schematic plan view showing a laminated piezoelectric element according to a first embodiment of the present invention;

FIG. 2 is a sectional view taken along a line A-A in FIG. 1;

FIG. 3 is a schematic plan view showing an electric field relaxation region of a first internal electrode of the laminated piezoelectric element according to the first embodiment;

FIG. 4 is a schematic plan view showing an electric field relaxation region of a second internal electrode of the laminated piezoelectric element according to the first embodiment;

FIG. 5 is a schematic plan view explaining an area ratio of the electric field relaxation region to the internal electrode;

FIG. 6 is a schematic plan view showing an internal electrode of the laminated piezoelectric element according to a second embodiment of the present invention; and FIG. 7 is a schematic plan view showing an internal electrode of the laminated piezoelectric element according to a third embodiment of the present invention.

DESCRIPTION OF EMBODIMENTS

Hereinafter, a laminated piezoelectric element according to embodiments of the present invention is described below with reference to the accompanying drawings.

A laminated piezoelectric element according to a first embodiment of the present invention is described with reference to FIGS. 1 to 3. FIG. 1 is a schematic plan view showing the laminated piezoelectric element according to the first embodiment of the present invention. FIG. 2 is a sectional view taken along a line A-A in FIG. 1. As shown in FIG. 1, the laminated piezoelectric element 10 according to the first embodiment has a structure is provided with a first external electrode 12 and a second external electrode 22 formed on a surface (a main surface) perpendicular to a laminating direction (a Z-direction in FIG. 1) of a laminated body 11 in rectangle shape. The first external electrode 12 and the second external electrode 22 are connected to a first connection electrode 14 and a second connection electrode 24 as described later, respectively.

As shown in FIG. 2, the laminated piezoelectric element 10 includes the laminated body 11 in rectangle shape formed by alternately laminating a plurality of piezoelectric layers 15 in rectangle shape and a plurality of internal electrodes 13, 23 in rectangle shape, a first connection electrode 14 formed on one side surface of the laminated body 11 in rectangle shape and connected to one end portion 13a of the plurality of first internal electrodes 13, and a second connection electrode 24 formed on the other side surface opposite to the one side surface of the laminated body 11 in rectangle shape and connected to one end portion 23a of the plurality of second internal electrodes 23. The first connection electrode 14 and the second connection electrode 24 are connected to the first external electrode 12 and the second external electrode 22, respectively. When a voltage is applied from the external electrodes 12, 22, a voltage is transmitted to the piezoelectric layer 15 between the internal electrodes 13, 23 and then the laminated body 11 in rectangle shape is displaced in the laminating direction in the laminated piezoelectric element 10.

(Internal Electrode and Electric Field Relaxation Region)

As shown in FIG. 3, the laminated piezoelectric element 10 includes electric field relaxation regions 16c and 16d formed discontinuously with regard to the first internal electrode 13 in at least one of two corner portions 13c and 13d on the other end portion 13b opposite to one end portion 13a of the first internal electrode 13. Here, "a corner portion" means a region including a corner and its vicinity virtually present when the internal electrode is formed in rectangle shape. And, a state that the internal electrode is solidly formed up to each corner along edges to show a rectangular shape is referred to as "continuously", whereas a state that a region where an electrode material is not present exists in part is referred to as "discontinuously". The electric field relaxation regions 16c and 16d in the first embodiment are provided, as shown in FIG. 3, in such a manner that a plurality of electrode deficient portions 13e are regularly formed in the corner portions 13c and 13d of the first internal electrode 13. The electric field relaxation regions 16c and 16d may be formed in only one first internal electrode 13 among the plurality of first internal electrodes 13 or may be formed in two or more first internal electrodes 13 among the plurality of first internal electrodes 13. In addition, FIG. 3 shows a case where the electric field relaxation regions 16c and 16d are respectively formed in both of two corner portions 13c and 13d of the other end portion 13b of the first internal electrode 13, but the electric field relaxation region may also be formed in either one of two corner portions 13c and 13d.

Further, as shown in FIG. 4, the laminated piezoelectric element 10 according to the first embodiment may have electric field relaxation regions 26c and 26d in two corner portions 23c and 23d of the other end portion 23b of the second internal electrode 23.

Since the laminated piezoelectric element 10 according to the first embodiment includes the electric field relaxation regions 16c and 16d formed discontinuously with regard to the first internal electrode 13 in the corner portions 13c and 13d on the other end portion 13b of the plurality of first internal electrodes 13, it is possible to disperse concentration of electric charges into the corner portions 13c and 13d of the first internal electrode 13 under high voltage, resulting in that dielectric breakdown of the piezoelectric layer 15 can be suppressed. Further, against a large stress concentrated on the piezoelectric layer 15 due to deformation of the piezoelectric layer 15 with application of high voltage, it is possible to disperse such large stress by providing the electric field relaxation regions 16c and 16d in the corner portions 13c and 13d of the first internal electrode 13, resulting in that breakage of the piezoelectric layer 15 can be suppressed.

Further, in the conventional laminated piezoelectric element, a structure is employed in which electric field concentration is relaxed by providing a corner cutoff portion in a corner portion of the internal electrode. On the contrast, since the electric field relaxation regions 16c and 16d according to the first embodiment has the same thickness as the first internal electrode 13 in comparison to the conventional laminated piezoelectric element with the corner cutoff portion, the laminated piezoelectric element is not impaired in flatness as a whole. Therefore, it is possible to successfully suppress occurrence of cracks in the laminated piezoelectric element. Furthermore, by providing the electrode deficient portion 13e, it is possible to reduce consumption of electrode material and decrease manufacturing cost of the laminated piezoelectric element 10.

As shown in FIG. 5, it is preferred to make the electric field relaxation regions 16c and 16d so as to be 0.1% or more to 20% or less in a total of the area 'b' of the electrode deficient portions 13e in the electric field relaxation region with respect to the area 'a' of one internal electrode in a top view. More preferably, it is 0.5% or more to 10% or less. By being 0.1% or more, it is possible to successfully suppress occurrence of dielectric breakdown and breakage. And, by being 20% or less, it is possible to maintain flatness of the laminated piezoelectric element as a whole.

The internal electrode may be formed of, for example, silver (Ag) or a silver-palladium (Ag—Pd) alloy. In particular, it is preferable that silver content of the internal electrode is larger in the first embodiment. The silver content of the internal electrode is preferably 50% by weight or more.

(Piezoelectric Layer)

The plurality of piezoelectric layers 15 are formed including ceramics with piezoelectric properties. Examples of such ceramics may include not only perovskite type oxides such as lead zirconate titanate ($PbZrO_3$—$PbTiO_3$) and alkali niobate type piezoelectric ceramics, but also so-called lead-free lithium niobate ($LiNbO_3$) and tantalum lithium oxide ($LiTaO_3$) or the like. A thickness of the piezoelectric layer 15 is preferably set in, for example, about 0.01 to 0.1 mm from the viewpoint of driving with low voltage. Further, from the viewpoint of increasing a displacement amount, a piezoelectric constant d31 is preferably set in 200 pm/V or more.

(External Electrode)

As shown in FIG. 2, the laminated piezoelectric element 10 according to the first embodiment includes the first external electrode 12 electrically connected to the first internal electrode 13 and the second external electrodes 22 electrically connected to the second internal electrode 23. The first external electrode 12 is provided on one main surface of the laminated piezoelectric element 10 and the second external electrodes 22 are provided on both main surfaces of the laminated body 11 in rectangle shape. The configuration of the external electrode is not limited thereto, and the first external electrodes 12 may be formed on both main surfaces perpendicular to the laminating direction or the Z-direction of the laminated body 11. As a material of the external electrode, the external electrode may be made of silver, a silver compound containing glass composed mainly of silica into silver, nickel or the like.

(Connection Electrode)

As shown in FIG. 2, the laminated piezoelectric element 10 is provided with the first connection electrode 14 connected to one end portion 13*a* of the plurality of first internal electrodes 13 on one side surface parallel to the laminating direction or the Z-direction of the laminated body 11 in rectangle shape. And, the laminated piezoelectric element 10 is provided with the second connection electrode 24 connected to one end portion 23*a* of the plurality of second internal electrodes 23 on the other side surface opposite to one side surface of the laminated body 11 in rectangle shape. As a material of the connection electrode, the connection electrode may be made of silver, a silver compound containing glass composed mainly of silica into silver, nickel or the like as similar to the external electrode.

In the first embodiment, described above is the laminated piezoelectric element 10 in which side electrodes are arranged on side surfaces of the laminated body 11 in rectangle shape formed by alternately laminating the piezoelectric layer 15 and the internal electrodes 13, 23 as the first connection electrode 14 electrically connecting the first external electrode 12 and the first internal electrode 13. However, through conductors penetrating through one end portion 13*a* of the first internal electrode 13 and the piezoelectric layer 15 may be employed in place of the side electrodes.

Next, a laminated piezoelectric element according to a second embodiment of the present invention is described with reference to FIG. 6. As shown in FIG. 6, a first internal electrode 33 of the laminated piezoelectric element 10 according to the second embodiment has electric field relaxation regions 36*c* and 36*d* formed by regularly arranging a plurality of holes 33*e* in corner portions 33*c* and 33*d*. Although the electric field relaxation regions 36*c* and 36*d* formed by regularly arranging the plurality of holes 33*e* are shown in the second embodiment, the plurality of holes 33*e* may be irregularly arranged.

Further, a laminated piezoelectric element according to a third embodiment of the present invention is described with reference to FIG. 7. As shown in FIG. 7, a first internal electrode 53 of the laminated piezoelectric element according to the third embodiment has electric field relaxation regions 56*c* and 56*d* including corner cutoff portions 53*e* formed in corner portions 53*c* and 53*d* and island-like electrode member layers 57 disposed in the corner cutoff portions 53*e* so as not to be conducted with the first internal electrode 53. Although the island-like electrode member layers 57 are not conducted with the first internal electrode 53 in the third embodiment, the electric field relaxation region is adjusted including an area of the island-like electrode member layers 57 into the above-mentioned "area 'a' of one internal electrode in a top view" when a formation range of the electric field relaxation region is determined.

The first internal electrode has been described with reference to FIGS. 6 and 7, but the second internal electrode may also have the electric field relaxation region as well.

The laminated piezoelectric element 10 of the above embodiments may be obtained, for example, by preparing a slurry through mixing material powder of the piezoelectric layer 15 with an organic solvent, a binder, a plasticizer, a dispersant and the like at a predetermined ratio, making ceramic green sheets of the slurry with a doctor blade method as known or the like, laminating the ceramic green sheets on the internal electrodes 13, 23 and the external electrodes 12, 22, removing the binder at 500° C. in the atmosphere, and then integrally firing at 1000° C. in the atmosphere. Not limited to the doctor blade method, the laminated piezoelectric element 10 may also be obtained, for example, by alternately printing and laminating a slurry containing material powder of the piezoelectric layer and a conductive paste containing an electrode material with a so-called slurry build method, and then integrally firing them.

The laminated piezoelectric elements according to the embodiments are suitable as a vibrator to be installed in thin electronic devices, mobile electronic devices and the like.

EXAMPLES

Hereinafter, the embodiments are described more specifically with reference to examples, but the scope of the present invention is not limited to the specific examples described below.

Example 1

The laminated piezoelectric element was made in such a manner that four piezoelectric layers each having a thickness of 75 μm were laminated to obtain a length of 50 mm, a width of 8 mm and a thickness of 0.3 mm. The piezoelectric layer was made of lead zirconate titanate ($PbZrO_3$—$PbTiO_3$), and the internal electrode was made of a silver-palladium (Ag—Pd) alloy. The internal electrode had a length of 48 mm and a width of 7 mm, and the discontinuous portion (the electric field relaxation region) in the corner portion was formed in a pattern shown in FIG. 3 within a range of 1 mm from the corner. Next, the external electrode and the connection electrode composed mainly of silver (Ag) were formed, and polarization was carried out. In the electric field relaxation region in Example 1, a total of the area 'b' of the electrode deficient portion 13*e* in the electric field relaxation region was 0.5% with respect to the area 'a' (see FIG. 5) of the internal electrode in a top view.

Example 2

The laminated piezoelectric element was made in the same manner as in Example 1 except that the internal electrode was provided with the discontinuous portion (the electric field relaxation region) in the corner portion, the discontinuous portion being formed in the pattern shown in FIG. 3 at a distance of 4 mm from the corner. A total of the area 'b' of the electrode deficient portion 13*e* in the electric field relaxation region was 10% with respect to the area 'a' of the internal electrode in a top view.

Comparative Example 1

The laminated piezoelectric element was made in the same manner as in Example 1 except that the internal electrode was not provided with the discontinuous portion at the corner portion.

Evaluation

With respect of the laminated piezoelectric elements of Examples 1, 2 and Comparative Example 1, wiring was made by solder and HALT (Highly Accelerated Limit Test) was conducted. As the results of HALT, in Examples 1 and 2 having the electric field relaxation region, abnormality was not brought about even when performing a combined step test of applying 90 Vpp for 5 cycles. On the contrast, in Comparative Example 1 having no electric field relaxation region, abnormality was brought about during test and a crack occurred. From the above, it was understood that, since the laminated piezoelectric element according to the embodiments had the electric field relaxation region, dielectric breakdown and breakage was suppressed even through long time use under high voltage, and thus high reliability was achieved.

REFERENCE SIGNS LIST

10 . . . laminated piezoelectric element;
11 . . . laminated body in rectangle shape;
12 . . . first external electrode;
22 . . . second external electrode;
13, 33, 53 . . . first internal electrode;
23 . . . second internal electrode;
13a, 23a, 33a, 53a . . . one end portion;
13b, 23b, 33b, 53b . . . the other end portion;
13c, 13d, 23c, 23d, 33c, 33d, 53c, 53d . . . corner portion;
14 . . . first connection electrode;
24 . . . second connection electrode;
15 . . . piezoelectric layer;
16c, 16d, 26c, 26d, 36c, 36d, 56c, 56d . . . electric field relaxation region;
13e . . . electrode deficient portion;
33e . . . hole;
53e . . . corner cutoff portion;
57 . . . island-like electrode member layer;
'a' . . . area of internal electrode; and
'b' . . . area of electrode deficient portion.

The invention claimed is:

1. A laminated piezoelectric element comprising:
a laminated body in rectangle shape formed by alternately laminating a plurality of piezoelectric layers and one or more internal electrodes;
a connection electrode connected to one end portion of the one or more internal electrodes; and
an electric field relaxation region formed discontinuously with regard to the one or more internal electrodes only at each of two corner portions of the other end portion opposite to the one end portion of the one or more internal electrodes,
wherein the one or more internal electrodes extend entirely in a rectangular shape as viewed in a thickness direction except at the two corner portions,
the two corner portions comprise the electric field relaxation region which is formed within the rectangular shape and is constituted by a partial electrode having a corner portion at each vertex of the two corner portions of the rectangular shape, and
wherein the electric field relaxation region is provided with at least one of a plurality of electrode deficient cutout portions at each corner, a plurality of electrode-deficient holes, and a plurality of insular electrodes isolated from each other.

2. The laminated piezoelectric element according to claim 1, wherein the electric field relaxation region is provided with the plurality of electrode deficient holes.

* * * * *